(12) United States Patent
Barrenscheen et al.

(10) Patent No.: US 10,848,354 B2
(45) Date of Patent: Nov. 24, 2020

(54) COMBINED DATA AND TIMING INFORMATION

(71) Applicant: Infineon Technologies AG, Neubiberg (DE)

(72) Inventors: Jens Barrenscheen, Munich (DE); Juergen Schaefer, Oberhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/122,347

(22) Filed: Sep. 5, 2018

(65) Prior Publication Data
US 2020/0076655 A1 Mar. 5, 2020

(51) Int. Cl.
*H04B 3/46* (2015.01)
*H04L 25/49* (2006.01)

(52) U.S. Cl.
CPC .............................. *H04L 25/4902* (2013.01)

(58) Field of Classification Search
CPC ................................................. H04L 25/4902
USPC ........................................................ 375/224
See application file for complete search history.

(56) References Cited

U.S. PATENT DOCUMENTS

| | | | | |
|---|---|---|---|---|
| 5,668,678 A * | 9/1997 | Reed | ................... | G11B 5/59655 360/51 |
| 5,987,320 A * | 11/1999 | Bobick | ................. | H04W 24/00 370/241 |
| 6,233,532 B1 * | 5/2001 | Boudreau | .......... | G05B 19/0423 340/870.21 |
| 8,121,542 B2 * | 2/2012 | Zack | ........................ | H04B 1/40 455/41.1 |
| 2003/0218553 A1 * | 11/2003 | Azinger | ................... | H03M 7/00 341/61 |
| 2006/0141999 A1 * | 6/2006 | Funnell | .................. | H04W 24/00 455/423 |
| 2010/0170345 A1 * | 7/2010 | Noguchi | ............... | G01N 29/022 73/646 |
| 2013/0321188 A1 * | 12/2013 | Hausmann | ............ | H03M 3/352 341/119 |
| 2014/0321295 A1 * | 10/2014 | Fella, Jr. | ................ | H04L 41/069 370/252 |

* cited by examiner

*Primary Examiner* — Helene E Tayong
(74) *Attorney, Agent, or Firm* — Schiff Hardin LLP

(57) ABSTRACT

A measurement apparatus for providing digital data to a controller, including an Analog-to-Digital Converter (ADC) configured to transform an analog signal into a modulated digital data stream; an event detector configured to generate event indication data based on an event related to the analog signal or the digital data; and a communication interface configured to combine the modulated digital data stream and the event indication data into one or more communication frames, and to transmit the one or more communication frames to the controller.

20 Claims, 3 Drawing Sheets

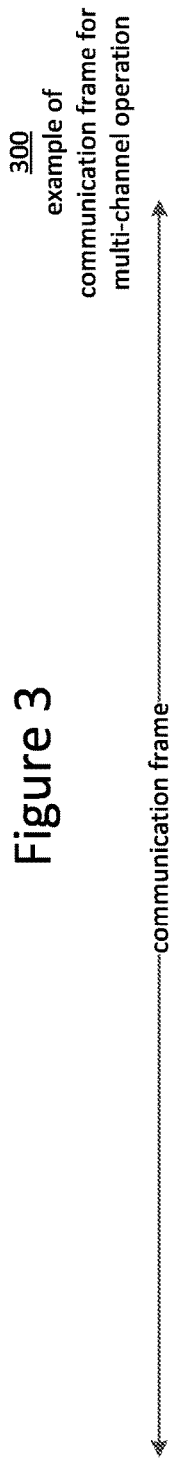
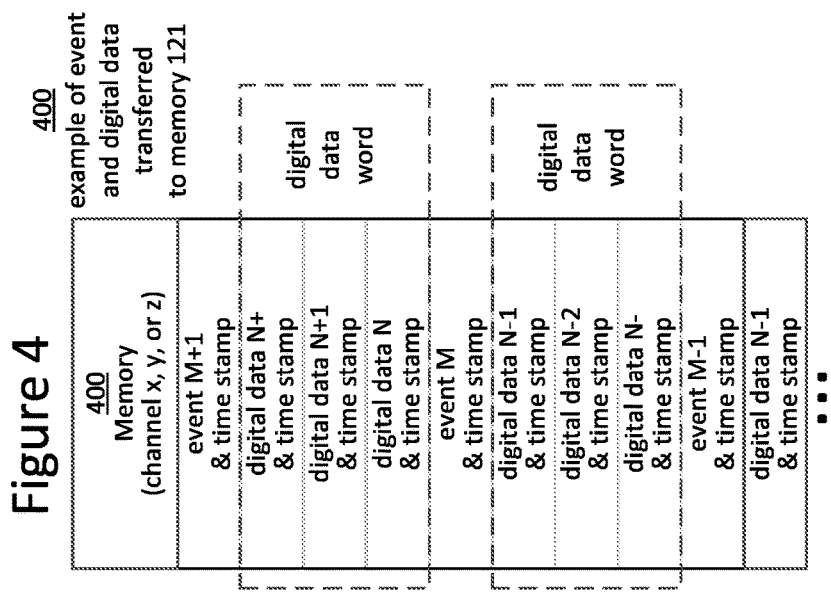
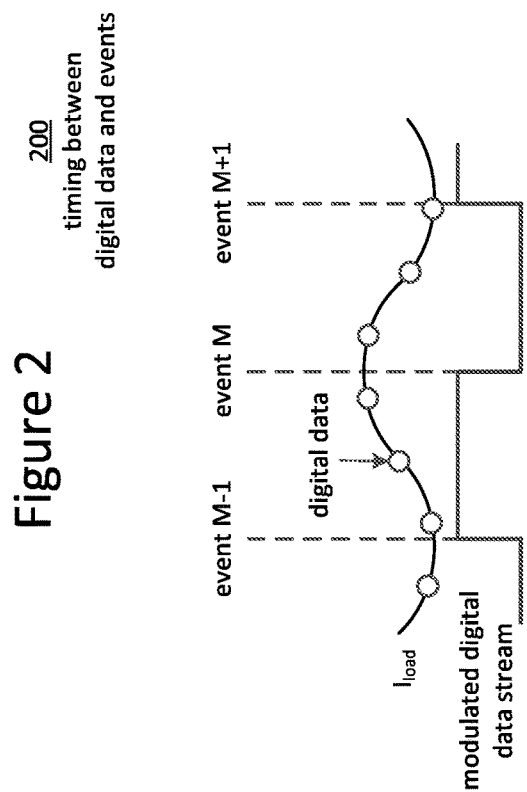

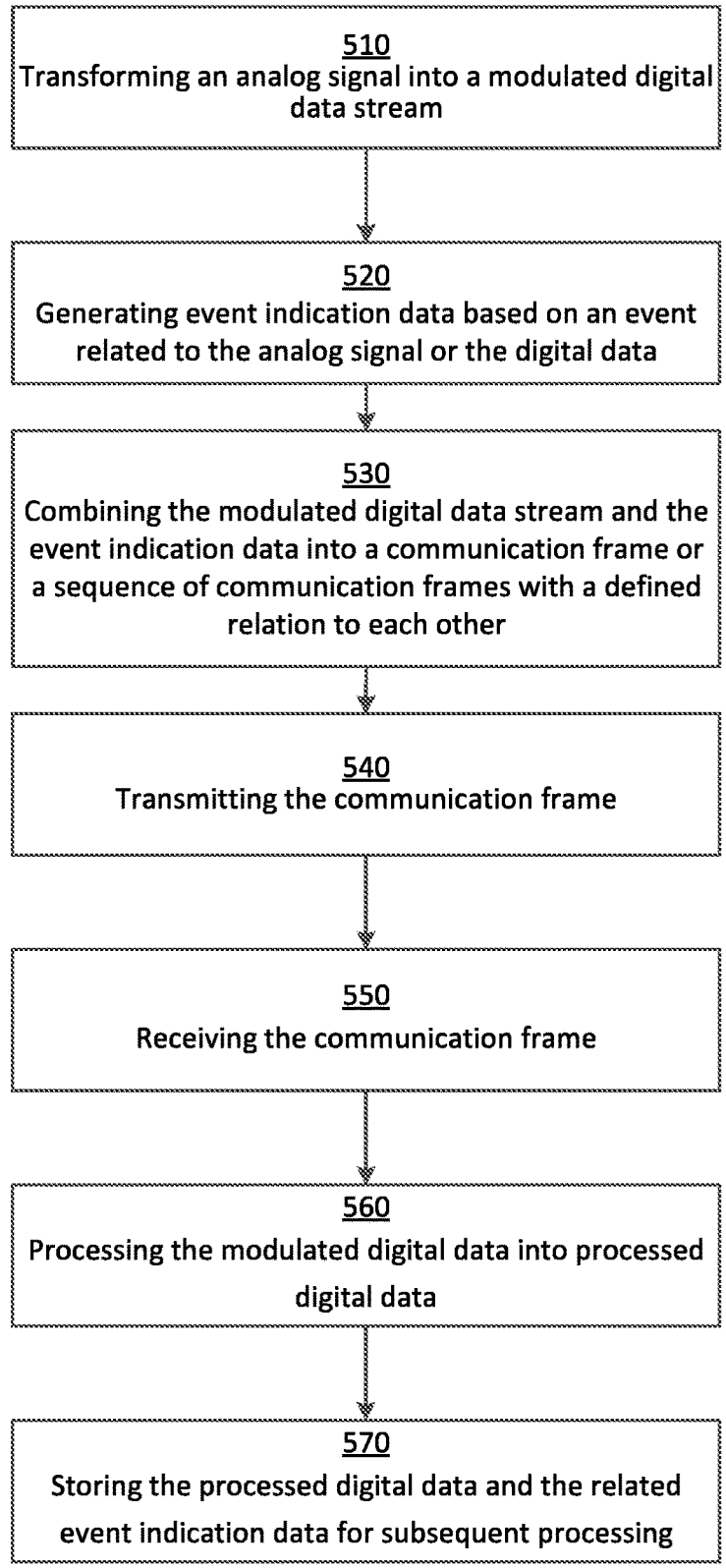

COMBINED DATA AND TIMING INFORMATION

BACKGROUND

Analog-to-Digital Converters (ADCs) are used by applications that require conversion of analog signals into digital data format for further processing. For example, an ADC of a measurement apparatus may transform an analog input signal of measurement data into a digital data stream for transmission to a controller.

The controller may experience internal events and external events. An internal event references a known clock source (e.g., an on-chip timer). An external event references an unknown clock source (e.g., an external clock source). When the controller and measurement apparatus are formed in a same semiconductor chip, their operations may reference a same on-chip timer. However, if the measurement apparatus and the controller are formed in separate semiconductor chips, the clock source of the measurement apparatus may be unknown to the controller, and thus the measurement apparatus and the controller would not have a common notion of time.

BRIEF DESCRIPTION OF THE DRAWINGS

FIG. 2 illustrates an example of timing relationships between data and events in accordance with aspects of the disclosure.

FIG. 3 illustrates an example of a communication frame for multi-channel operation.

FIG. 4 illustrates a memory in accordance with aspects of the disclosure.

FIG. 5 illustrates a flowchart of a method in accordance with aspects of the disclosure.

DETAILED DESCRIPTION

Figure 1:
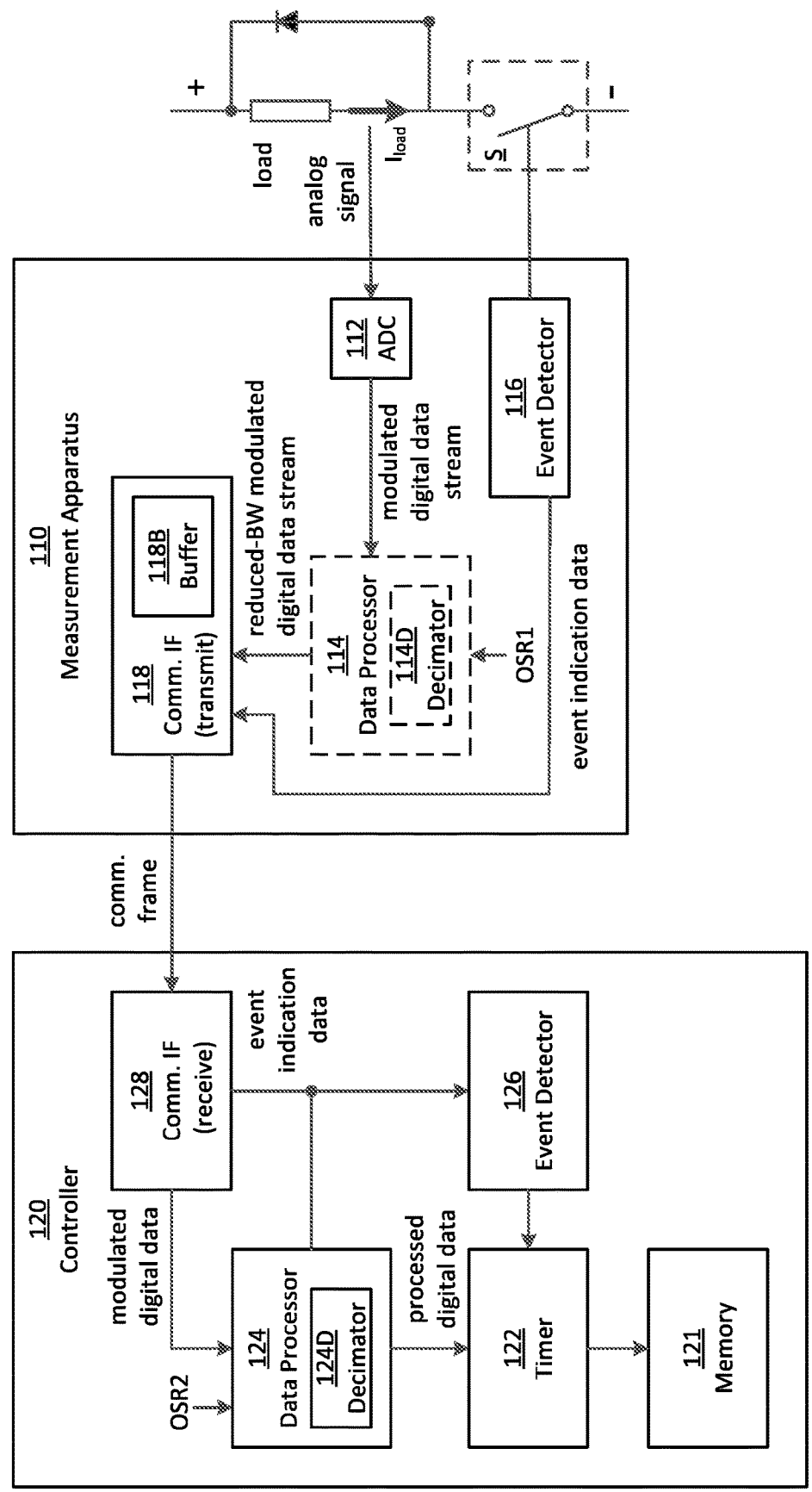
FIG. 1 illustrates a schematic diagram of a system in accordance with aspects of the disclosure.

The present disclosure focuses on the processing of digital data in relation to external events, that is, events referenced to an unknown clock source. An Analog-to-Digital Converter (ADC) in a measurement apparatus transforms an analog signal into a modulated digital data stream for transmission to a controller. The controller does not need to know the specific acquisition time of the analog signal, but instead a timing relationship between the digital data and related events. The measurement apparatus allows the controller to determine this timing relationship by combining the modulated digital data stream and related event indication data into a communication frame.

FIG. 1 illustrates a schematic diagram of a system 100 in accordance with aspects of the disclosure.

The system 100 comprises a measurement apparatus 110 and a controller 120. The measurement apparatus 110 is configured to provide digital data to the controller 120. The measurement apparatus 110 and the controller 120 may be formed in separate semiconductor chips.

In the case where switching of a power switch S is an event and a current through a load connected to that power switch S is measured, the timing relationship between the switching and the analog-to-digital conversion is important.

The measurement apparatus 110 comprises an Analog-to-Digital Converter (ADC) 112, an event detector 116, a communication interface 118, and an optional data processor 114.

The ADC 112 is configured to transform an analog signal into a modulated digital data stream. The ADC 112 may be a Pulse Width Modulation (PWM) generator, a Pulse Density Modulation (PDM) generator, a Sigma Delta (SD) modulator, a delta modulator, or the like.

The event detector 116 is configured to generate event indication data based on an event related to the analog signal or the digital data. The event indication data may be switching of the power switch S, and may additionally comprise status information of the measurement apparatus 110.

The communication interface 118 is configured to combine the modulated digital data stream and the event indication data into one or more communication frames, and to transmit the one or more communication frames to the controller 120. The communication interface 118 is configured to combine into the communication frame the digital data stream and the event indication data from a plurality of analog signals or from a plurality of events. Also, the communication interface 118 comprises a buffer 118B configured to buffer the combined digital data stream and event indication data when the communication interface 118 is busy transmitting other data. There may by separate buffers for ADC-related data and event or status data. Alternatively, there may be a different number of buffer stages for ADC-related data and event or status data.

The communication interface 118 may be configured to combine into the communication frame a single word of the modulated digital data stream and a related single event word of the event indication data. Alternatively, the communication interface 118 may be configured to combine into the communication frame a plurality of words of the modulated digital data stream (in a multi-channel operation) and with a related single word of the event indication data (e.g., two channels might relate to the same event indication data word). Alternatively, the communication interface 118 may be configured to combine into the communication frame a single word of the modulated digital data stream and a related plurality of event indication words of the event indication data. The communication interface 118 may be configured to combine several words of the modulated digital data stream into a single communication frame. There is no required format, except that the combination of information should remain in a defined relation to each other during the complete communication transmission from the measurement apparatus 110 to the controller 120. Some communication frames may comprise modulated digital data words, while other communication frames may comprise event or status information. Here, the relation may be provided over a sequence of communication frames. The defined relation may include a relation between X words of ADC-related data to Y words of event or status data (X may be equal to Y, or X may be greater than Y, with X/Y being constant or variable). If ADC-related data and event or status data is combined into a single communication frame, the relation may be defined by the position of the data words in the communication frame.

The optional data processor 114 is configured to reduce, by an oversampling factor OSR1, the modulated digital data stream to a reduced-bandwidth modulated digital data stream for more efficient transmission. The data processor 114 may comprise a decimator 114D, which performs the reduction. The event detector 116 (discussed above) may be separate from, or alternatively a part of, the data processor 114.

The controller 120 comprises a communication interface 128, a data processor 124, a memory 121, an event detector 126, and a timer 122.

The communication interface 128 is configured to receive from the measurement apparatus 110 one or more communication frames having modulated digital data and/or related event indication data. This modulated digital data may be reduced-bandwidth modulated digital data as discussed above.

The communication interface of the system 100 is comprised of the transmitter communication interface 118 (in the measurement apparatus 110) and the receiver communication interface 128 (in the controller 120). The system communication interface is a serial communication interface that may operate in accordance with standard communication protocols and physical layers, such as High Speed Serial Link (HSSL), high-speed Universal Asynchronous Receiver-Transmitter (UART), SPI, Ethernet, etc. The system communication interface may use Low Voltage Differential Signaling (LVDS) as physical layer. The transmission bandwidth can thereby be increased significantly and on fewer communication lines between the measurement device 110 and the controller 120.

The communication frame transmission timing is not strictly predictable due to reaction times and jitter, especially if the communication interface 118 is also used to transfer other types of data, such as configuration or status data, or is shared between several communication partners. In this case, the available bandwidth of the communication interface 118 may be shared between several types of data frames or communication partners. If the transmission timing is constant, a constant delay could be assumed. In most cases though, the timing for the transmission of ADC-related data is not constant, and the jitter may lead to data misinterpretation, not of the digital data itself, but of the measurement apparatus' analog data acquisition time. Tagging the digital data with the event indication data allows for flexibility in communication frame transmission timing to ensure consistency between the notion of time and data. This also implies that a communication interface 118 and 128 may be shared between different types of data frames or communication partners. Additionally, the use of existing, timing-wise unpredictable communication interfaces becomes possible without the need for dedicated communication interfaces. The transfers of communication frames may be based on a regular time base or may be event driven (e.g., the modulated data stream information may only be valid between two events or in a defined time interval). The transfers of communication frames may be triggered or controlled by the transmitter or by the receiver (either one or the other may be the communication master). The communication frame may comprise an identifier field indicating which type of data (or from which communication partner) is transferred in the frame. Such identifiers may simplify the handling of the received data by the controller and may also be used to establish the relation between ADC-related data and event or status data. The data words included in the received frames may be distributed to one or more data processors or event detectors in the controller based on their position in the frame and/or the received identifiers. Especially if several communication partners (e.g., two or more measurement apparatuses) share a communication interface to a controller, it is important to correctly distribute the received information in the controller for further treatment.

The data processor 124 is configured to process the modulated digital data into processed digital data. The data processor 124 comprises a decimator 124D configured to decimate the modulated digital data by an oversampling factor OSR2 in order to reduce an update rate of the processed digital data.

The event detector 126 is configured to detect events in the event indication data. The event detector 126 may be separate from, or alternatively a part of, the data processor 124, as long as the modulated digital data and the event indication data can be separated before further treatment.

The timer 122 is configured to generate time stamps indicating when the processed digital data and the event indication data are received by the controller 120, either at the communication interface 128 or timer 122, which should be more or less identical. The exact time when the digital data and event indication data are received is not important here, but the timing relationships between receipt of the processed digital data and the event indication data. For example, if the time between first and second events is 10 ms, the processed digital data is known to belong to that time interval. Furthermore, processed digital data may be considered for or discarded from further treatment if it is inside or outside an interval defined by the event information.

The memory 121 is configured to store the processed digital data and the related event indication data for subsequent processing. The memory 121 may be configured to store the processed digital data and the event indication data together with the timing data. The memory 121 may be further configured to store the processed digital data and the event indication data in the same or different formats. An example of this memory 121 is shown in FIG. 4, which is described below.

Partitioning the data processor into the measurement apparatus' optional data processor 114 and the controller's data processor 124, thereby splitting the oversampling factor into separate factors OSR1 and OSR2, reduces the bandwidth required to transmit the communication frame. There is a compromise between transmission bandwidth and timing granularity of the transmitted data. Transmitting the modulated digital data stream in completely undecimated form by not including the data processor 114 is also possible, but requires more bandwidth.

This partitioning results in the timing relation between the events at the measurement apparatus 110 and the availability of the decimated data in the controller 120 difficult to obtain. This is especially the case when the communication interface 118 does not transmit on an equidistant time base, but instead whenever the communication channel is available; the communication channel might be shared with other data sources. As a consequence, the point in time when decimated digital data is available in the controller 120 does not necessarily indicate the point in time of an event in the measurement apparatus 110.

The communication interface 118 of the measurement apparatus 110 combining the modulated digital data stream (either at full bandwidth or reduced-bandwidth) with the event indication data into a common communication frame or separate frames with a defined relation to each other resolves this problem. In the controller 120, the modulated digital data and the event indication data can be split again by the communication interface 128, and treated separately; the modulated digital data is decimated by the decimator 124D of the data processor 124, and the event data is detected by the event detector 126 and time stamped by the timer 122.

An example of the system 100 may involve a Sigma Delta (SD) ADC. An SD ADC comprises a delta-sigma modulator, followed by a decimation filter. The goal of delta-sigma modulation is to achieve higher resolution of the processed data compared to other types of ADC (e.g., of the Successive Approximation Register (SAR) type). The accuracy of this modulation is improved by passing a digital output through an N-bit DAC (N may be 1 or higher) and adding (sigma) the resulting analog signal to the input signal (the signal before delta modulation), thereby reducing any error introduced by the delta modulation. In such as example, the ADC 112 may be an SD modulator, the modulated digital data stream may be SD data, the data processor 112 may be a first SD demodulator, the reduced-bandwidth modulated digital data stream may be pre-decimated SD data, the data processor 124 may be a second SD demodulator, and the processed digital data may be decimated digital data.

FIG. 2 illustrates an example 200 of timing between data and events M−1, M, and M+1 in accordance with aspects of the disclosure. The events may be, for example, switching events. The curved signal represents an analog load current signal, and the circles indicate digital data resulting from analog-to-digital conversion of the analog load current signal. The modulated digital data stream square wave signal may be, for example, a PWM signal.

FIG. 3 illustrates an example of a communication frame 300 for multi-channel operation.

The communication frame 300 comprises the combined event indication data (Ex, Ey, and Ez) and the modulated digital data Dx, Dy, and Dz for three channels x, y, and z. In this example, the event indication data Ex and modulated digital data Dx are related to channel x, etc. The order of the data is merely an example, and the bit widths of the data are not limited. The communication frame format may comprise other types of data, such as status or control data. The communication frame format is not limited, provided the bandwidth and repetition rate of the communication frame 300 permits correct system operation.

The event indications Ex, Ey, and Ez may comprise status information about the measurement apparatus' operating condition, such as power supply, temperature, or any other type of status information. This additional information may be stored together with a time stamp for the event.

Further, the communication frame 300 may comprise a single word of the modulated digital data and a related single word of the event indication data. Alternatively, the communication frame 300 may comprise a plurality of words of the modulated digital data and a related single word of the event indication data. Alternatively, the communication frame 300 may comprise a single word of modulated digital data and related plurality of words of event indication data.

FIG. 4 illustrates a memory 400 in accordance with aspects of the disclosure.

The memory 400 illustrates an example of the structure of data for channel x, y, or z transferred to the memory 121 for subsequent treatment by a processor. The data format for processed digital data, event indication data, and time stamps might allow the processor to more simply search for new time stamps. For example, the processed digital data, event data, and the time stamps may appear in time order to ensure that the processed digital data are retrieved with correct timing relations with respect to events.

FIG. 5 illustrates a flowchart 500 of a method performed by the system 100 in accordance with aspects of the disclosure.

In Step 510, transforming, by an ADC 112, an analog signal into a modulated digital data stream.

In Step 520, generating, by an event detector 116, event indication data based on an event related to the analog signal or the digital data.

In Step 530, combining, by a communication interface 118, the modulated digital data stream and the event indication data into a communication frame or a sequence of communication frames with a defined relation to each other.

In Step 540, transmitting, by the communication interface 118, the communication frame(s).

In Step 550, receiving, by a communication interface 128, the communication frame(s).

In Step 560, processing, by a data processor 124, the modulated digital data into processed digital data.

In Step 570, storing, by a memory 121, the processed digital data and the related event indication data for subsequent processing.

The aspect of the present disclosure are advantageous in that the modulated digital data and event indication data are combined to ensure that effects due to group delay and data transfer over a communication channel can be compensated. Also, the timing relation between events and the original analog signal can be reconstructed.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A measurement apparatus for providing digital data to a controller, comprising:
   an Analog-to-Digital Converter (ADC) configured to transform an analog signal into a modulated digital data stream;
   an event detector configured to generate event indication data based on an event related to the analog signal or the digital data; and
   a communication interface configured to combine the modulated digital data stream and the event indication data into a communication frame to indicate to the controller a timing relationship of the digital data relative to the event, and to transmit the communication frame to the controller.

2. The measurement apparatus of claim 1, further comprising:
   a data processor configured to reduce, by a decimation factor, bandwidth for transmission of the modulated digital data stream.

3. The measurement apparatus of claim 1, further comprising:
   a buffer configured to buffer the combined digital data stream and event indication data when the communication interface is busy transmitting other data.

4. The measurement apparatus of claim 1, wherein the communication interface is configured to combine into the communication frame the digital data stream or the event indication data from a plurality of analog signals or from a plurality of events into the communication frame.

5. The measurement apparatus of claim 1, wherein the ADC is a Pulse Width Modulation (PWM) generator, a Pulse Density Modulation (PDM) generator, a Sigma Delta (SD) modulator, or a delta modulator.

6. The measurement apparatus of claim 1, wherein the communication interface is configured to combine into the communication frame a single word of the modulated digital data stream and a related single event word of the event indication data.

7. The measurement apparatus of claim 1, wherein the communication interface is configured to combine into the communication frame a plurality of words of the modulated digital data stream and with a related single word of the event indication data.

8. The measurement apparatus of claim 1, wherein the communication interface is configured to combine into the communication frame a single word of the modulated digital data stream and a related plurality of event indication words of the event indication data.

9. The measurement apparatus of claim 1, wherein the event indication data comprises status information of the measurement apparatus.

10. A controller, comprising:
a communication interface configured to receive from a measurement apparatus a communication frame having modulated digital data and related event indication data combined therein to indicate to the controller a timing relationship of the digital data relative to the event
a data processor configured to process the modulated digital data into processed digital data; and a memory configured to store the processed digital data and the related event indication data for subsequent processing.

11. The controller of claim 10, wherein the data processor comprises:
a decimator configured to decimate the modulated digital data to reduce an update rate of the processed digital data.

12. The controller of claim 11, further comprising:
a timer configured to generate timing data about the timing relationship between the decimated processed digital data and the event indication data.

13. The controller of claim 12, further comprising:
a memory configured to store the decimated processed digital data and the event indication data together with the timing data.

14. The controller of claim 13, wherein the memory is further configured to store the decimated processed digital data and the event indication data in different formats.

15. The controller of claim 10, wherein the event indication data comprises status information of the measurement apparatus.

16. The controller of claim 10, wherein the communication frame comprises a single word of the modulated digital data and a related single word of the event indication data.

17. The controller of claim 10, wherein the communication frame comprises a plurality of words of the modulated digital data and a related single word of the event indication data.

18. The controller of claim 10, wherein the communication frame comprises a single word of modulated digital data and related plurality of words of event indication data.

19. A system, comprising:
a measurement apparatus, comprising:
an Analog-to Digital Converter (ADC) configured to transform an analog signal into a modulated digital data stream;
a event detector configured to generate event indication data based on an event related to the analog signal or the digital data; and
a communication interface configured to combine the modulated digital data stream and the event indication data into one or more communication frames, and to transmit the one or more communication frames; and
a controller, comprising:
a communication interface configured to receive the one or more communication frames;
a data processor configured to process the modulated digital data into processed digital data; and
a memory configured to store the processed digital data and the related event indication data for subsequent processing.

20. The system of claim 19, wherein the measurement apparatus and the controller are formed in separate semiconductor chips.

* * * * *